US 009508579B2

(12) United States Patent
Nakano

(10) Patent No.: US 9,508,579 B2
(45) Date of Patent: Nov. 29, 2016

(54) PURGE APPARATUS AND LOAD PORT

(75) Inventor: Takaaki Nakano, Minato-ku (JP)

(73) Assignee: SINFONIA TECHNOLOGY CO., LTD., Tokyo (JP)

(*) Notice: Subject to any disclaimer, the term of this patent is extended or adjusted under 35 U.S.C. 154(b) by 1026 days.

(21) Appl. No.: 13/483,128

(22) Filed: May 30, 2012

(65) Prior Publication Data

US 2012/0309286 A1 Dec. 6, 2012

(30) Foreign Application Priority Data

May 31, 2011 (JP) ................................. 2011-121453

(51) Int. Cl.
*F24F 13/06* (2006.01)
*H01L 21/673* (2006.01)
*H01L 21/677* (2006.01)

(52) U.S. Cl.
CPC ... *H01L 21/67389* (2013.01); *H01L 21/67775* (2013.01)

(58) Field of Classification Search
CPC ............. H01L 21/67389; H01L 21/67393; H01L 21/67775
USPC ....... 454/49, 56, 187, 188, 193, 305; 20/711
See application file for complete search history.

(56) References Cited

U.S. PATENT DOCUMENTS

| 7,648,581 B2* | 1/2010 | Moriya ................. B08B 7/0021 134/1 |
| 2004/0237244 A1* | 12/2004 | Suzuki et al. .................. 15/301 |
| 2010/0126532 A1* | 5/2010 | Tamada et al. .................. 134/26 |
| 2010/0135753 A1* | 6/2010 | Natsume et al. .......... 414/217.1 |
| 2010/0215461 A1* | 8/2010 | Kamikawa et al. ..... 414/222.13 |
| 2011/0214778 A1 | 9/2011 | Natsume et al. |

FOREIGN PATENT DOCUMENTS

| JP | 2006-351619 | 12/2006 |
| JP | 2012-164948 A | 8/2012 |

OTHER PUBLICATIONS

Office Action issued Mar. 24, 2015 in Japanese Patent Application No. 2011-121453.

* cited by examiner

*Primary Examiner* — Gregory Huson
*Assistant Examiner* — Dana Tighe
(74) *Attorney, Agent, or Firm* — Oblon, McClelland, Maier & Neustadt, L.L.P.

(57) ABSTRACT

A purge apparatus for replacing a gas atmosphere in a purge object vessel by a purge gas through a port provided on a bottom face of the purge object vessel is disclosed. The purge apparatus includes a purge unit attached to a table that receives the purge object vessel, and a purge nozzle body including a port contacting portion provided on an upper side of the purge nozzle body and an attachment object portion provided on a lower side of the purge nozzle body. The purge unit has an attachment portion and the port contacting portion of the purge nozzle body is configured to contact the port of the purge object vessel. The attachment object portion of the purge nozzle body removably engages with the attachment portion of the purge unit so that the purge nozzle body is removably attached to the purge unit.

8 Claims, 9 Drawing Sheets

PURGE APPARATUS AND LOAD PORT

CROSS REFERENCE TO RELATED APPLICATION

This application claims priority to Japanese Application Number 2011-121453, filed on May 31, 2011, the entire contents of which are hereby incorporated by reference.

BACKGROUND

Field of the Disclosure

This disclosure relates to a purge apparatus which carries out a purge process for a purge object vessel having a purge object space and a load port which includes a purge apparatus. More specifically, the present disclosure relates to a load port provided adjacent a semiconductor fabrication apparatus in a clean room and a purge apparatus which can be applied to a purge station or the like.

Description of the Related Art

In a fabrication process of semiconductors, processing of a wafer is carried out in a clean room to assure a high yield and high quality. However, in this day of highly integrated devices, miniaturized circuitry and wafers of increased sizes, it is difficult in terms of cost and technology to manage fine dust in an entire clean room. Therefore, in recent years, means configured to carry out transport and other processes of wafers employing a "minienvironment system" which improves the cleanness only of a local space around a wafer is adopted as a method which replaces the cleanness improvement of an entire clean room. In the minienvironment system, a containment called FOUP (Front-Opening Unified Pod) for transporting and storing a wafer in a highly clean environment and a load port which is an interface section for transferring a wafer from within the FOUP into a semiconductor fabrication apparatus or from the semiconductor fabrication apparatus into the FOUP and carrying out transfer of a FOUP to and from a transport apparatus are utilized as important apparatus. In particular, while the inside of the clean room, particularly the inside of the FOUP and the inside of the semiconductor fabrication apparatus, are kept in high cleanness, the space in which the load port is disposed, or in other words, the outside of the FOUP and the outside of the semiconductor fabrication apparatus, are allowed to be in low cleanness so that the construction and operating costs of the clean room are suppressed. Here, the FOUP has a loading entrance for a wafer on the front thereof and includes a door which can close up the loading entrance.

Thus, in a state in which a door section provided on the load port is kept in close contact with the door provided on the front of the FOUP, the door section and the door are opened simultaneously. Then, a wafer in the FOUP is supplied through the loading entrance into the semiconductor fabrication apparatus. Thereafter, the wafer for which various kinds of processing or working have been carried out is accommodated back into the FOUP from within the semiconductor fabrication apparatus.

Incidentally, while the inside of the semiconductor fabrication apparatus is maintained in a predetermined gas atmosphere suitable for processing or working of a wafer, when a wafer is to be forwarded from within the FOUP into the semiconductor fabrication apparatus, the internal space of the FOUP and the internal space of the semiconductor fabrication apparatus are placed into a mutually communicated state. Accordingly, if the environment in the FOUP is lower in cleanness than that in the inside of the semiconductor fabrication apparatus, then the gas in the FOUP may advance into the semiconductor fabrication apparatus and have a bad influence on the gas atmosphere in the semiconductor fabrication apparatus. On the other hand, when a wafer is to be accommodated into the FOUP from within the semiconductor fabrication apparatus, an oxide film may possibly be formed on the surface of the wafer by water, oxygen or some other gas in the gas atmosphere in the FOUP.

As a technique for coping with such problems as described above, a load port is disclosed in Japanese Patent Laid-Open No. 2009-038074. The load port includes a purge apparatus which blows predetermined gas such as, for example, nitrogen or inert gas into the FOUP by a purge section or purge nozzle provided on the semiconductor fabrication apparatus side with respect to the opening in a state in which the internal space of the FOUP and the internal space of the semiconductor fabrication apparatus are communicated with each other with the door of the FOUP opened by the door section of the load port.

However, according to such a purge apparatus of the front purge type which injects predetermined gas into the FOUP from the front side, that is, from the semiconductor fabrication apparatus side, into the FOUP opened to the inner space of the semiconductor fabrication apparatus through the loading entrance to place the inside of the FOUP into a predetermined gas atmosphere, a purge process is carried out in a state in which the opening of the FOUP is opened so that the internal space of the FOUP is directly communicated with the entire internal space of the semiconductor fabrication apparatus. Therefore, the purge apparatus has a disadvantage that it is difficult to keep the inside of the FOUP in a high predetermined gas atmosphere concentration and the reaching concentration of the predetermined gas atmosphere is low.

Meanwhile, Japanese Patent Laid-Open No. 2006-351619 discloses a load port which includes a purge apparatus which injects, when it is detected that a FOUP in which a wafer is accommodated is placed on a receiving table of the load port, predetermined gas such as nitrogen or inert gas into the FOUP from the bottom face side of the FOUP to fill the FOUP to place the inside of the FOUP into a predetermined gas atmosphere. Such a purge apparatus of the bottom purge type which injects gas such as nitrogen or dry air into the FOUP from the bottom face side of the FOUP to place the inside of the FOUP into a predetermined gas atmosphere as just described is advantageous in that the reaching concentration of the predetermined gas atmosphere is high in comparison with the purge apparatus of the front purge type.

SUMMARY OF THE DISCLOSURE

In the purge apparatus of the bottom purge type described above, since a purge process is carried out in a state in which a purge nozzle contacts with a tubular portion, that is, a loading entrance, provided on the bottom face of the FOUP, it is necessary to secure good air tightness in a state in which the port and the purge nozzle contact with each other. However, if the type or shape of the port is different depending upon the type of the FOUP, then a good contact state with which high air tightness between the purge nozzle and the port is secured may not be secured.

Also when a tip end portion, that is, an upper end portion, of the purge nozzle which can contact with the port suffers from abrasion, damage or deformation depending upon time-dependent deterioration or the frequency of use, there is the possibility that a good contact state with high air tightness secured with the port may not be secured.

In order to prevent such situations as described above, it seems advisable to configure a purge apparatus such that the purge nozzle can be replaced in response to the type or shape of the port or the degree of abrasion of or damage to a purge nozzle tip end portion.

However, since the purge nozzle is held in the form of a unit on the receiving table at a predetermined place, it is cumbersome to carrying out a replacing operation including removing and mounting the purge nozzle unit entirely from and on the receiving table, and the replacing operation cannot be carried out smoothly.

Also it seems a possible idea to use a mode wherein a seal member such as an O-snap ring is interposed between the purge nozzle and the port in order to enhance the air tightness between them. However, such a mode as just described not only gives rise to increase of the number of parts but also has an influence unfavorably on the heightwise position of a horizontal datum plane of the FOUP prescribed by the SEMI (Semiconductor Equipment and Materials International) standards. In particular, by the interposition of the seal member between the purge nozzle and the port, it is difficult to set the heightwise position of the horizontal datum plane accurately to a value prescribed by the standards. The horizontal datum plane of the FOUP is defined by the distance from the floor level to a bottom horizontal plane of the FOUP installed on the load port.

While the FOUP is placed on the receiving table from above the load port through a transport apparatus such as an OHT (Overhead Hoist Transfer) apparatus, it is sometimes different for the purge nozzle and the port to contact with each other in a highly airtight condition upon transfer or upon placement because the FOUP fluctuates. Particularly if the purge nozzle is mounted on the receiving table in a state in which the tip or upper end portion thereof does not lie in a horizontal posture, then it is difficult to place the purge nozzle and the port into contact with each other in a state in which high air tightness is secured between them.

Such a failure as just described can possibly occur not only with a purge apparatus of a load port but also with a purge apparatus not of a load port but of a stocker or a purge station.

It is an object of the present disclosure to provide a purge apparatus which can carry out a purge process wherein the reaching concentration of a predetermined gas atmosphere is high and by which a replacing operation with a purge nozzle having a tip end portion, that is, a port contacting portion, different in type or shape or an operation for maintenance of a purge nozzle can be carried out simply and smoothly in accordance with a type or a shape of a port attached to a purge object vessel.

In particular, the present disclosure relates to a purge apparatus capable of replacing a gas atmosphere in a purge object vessel into nitrogen gas or dry air through a port provided on the bottom face of the purge object vessel. The "purge object vessel" of the present disclosure is a general vessel or container having a purge object space in the inside thereof such as a FOUP.

The purge apparatus according to the present disclosure includes a bottom purge unit attached to a receiving table on which the purge object vessel can be placed, and a bottom purge nozzle main body including a port contacting portion provided at an upper end portion thereof and capable of contacting with the port and an attachment object portion provided at a lower end portion thereof and capable of engaging with an attachment portion formed on the bottom purge unit, the bottom purge nozzle main body being capable of being attached to the bottom purge unit by removably engaging the attachment object portion with the attachment portion, the port contacting portion being positioned at a fixed position and placed substantially horizontally in a state in which the attachment object portion is engaged with the attachment portion.

Since, in the purge apparatus according to the present disclosure, the bottom purge nozzle main body is removably attached to the bottom purge unit provided on the receiving table in this manner, where the nozzle is to be changed to a nozzle of a different type in response to the type or the shape of the port which is different depending upon the type or the like of the purge object vessel, only the bottom purge nozzle main body can be changed over suitably without requiring complicated operation of removing and re-mounting the entire unit from and on the receiving table. Further, it is possible to secure a good contacting state in which high air tightness between the bottom purge nozzle main body and the port is secured. Further, where the port contacting portion of the bottom purge nozzle main body capable of contacting with the port is abraded, damaged or deformed depending upon time-dependent deterioration or the frequency of use or where the compatibility between the purge object vessel and the port is not good, a good contacting state in which high air tightness with the port is secured can be secured by replacing the bottom purge nozzle main body with a new bottom purge nozzle main body or a different bottom purge nozzle main body which is not abraded, damaged or deformed.

Further, since the port contacting portion of the bottom purge nozzle main body in the purge apparatus according to the present disclosure is positioned at a fixed position in a state in which the attachment object portion of the bottom purge nozzle main body engages with the attachment portion of the bottom purge unit, in comparison with an alternative mode in which a seal member for exclusive use is interposed between the port and the bottom purge nozzle main body to secure high air tightness, the seal member for exclusive use is not required. Further, a horizontal datum plane of the purge object vessel prescribed in the standards can be set with high accuracy without taking the heightwise size of the seal member into consideration. In addition, since the port contacting portion of the bottom purge nozzle main body in the purge apparatus according to the present disclosure is placed substantially horizontally in a state in which the attachment object portion of the bottom purge nozzle main body engages with the attachment portion of the bottom purge unit, in comparison with an alternative mode in which the bottom purge nozzle main body is simply thrust into and attached to the bottom purge unit, a wavering behavior of the bottom purge nozzle main body with respect to the bottom purge unit can be prevented and suppressed. Further, the port of the purge object vessel can be contacted with the port contacting portion placed substantially horizontally in a state in which high air tightness is secured.

Further, in the purge apparatus according to the present disclosure, as a mode in which the attachment object portion of the bottom purge nozzle main body and the attachment portion of the bottom purge unit are engaged with each other, not only a mode in which one of the attachment object portion and the attachment portion is a recessed portion and the other one of the portions is a projected portion such that the recessed portion and the projected portion are engaged with each other but also another mode in which the attachment object portion is inserted into the attachment portion and pivotally turned in a predetermined direction so that the purge apparatus is placed into a locked state can be adopted. However, a mode in which the attachment object portion is a male screw or a female screw and the attachment portion is a male screw or a female screw corresponding to the attachment object portion such that the male screw is screwed into the female screw is preferable in that the structure is simple and replacing operation of the bottom purge nozzle main body can be carried out easily and smoothly.

Further, a load port of the present disclosure is provided in an adjacent relationship to a semiconductor fabrication apparatus in a clean room and is adapted to receive a FOUP which is a purge object vessel carried thereto and then transfer a wafer accommodated in the FOUP through a carrying entrance formed on the front face of the FOUP between the inside of the semiconductor fabrication apparatus and the inside of the FOUP. Further, the load port includes the purge apparatus having the configuration described above.

With such a load port as described above, the working effects described can be implemented by the purge apparatus, and, by replacing the bottom purge nozzle main body with another bottom purge nozzle main body suitable for an applied one of FOUPs which are different in type or shape of the port, high air tightness can be secured in a state in which the purge nozzle and the port are contacted with each other. Consequently, a purge process by which a high reaching concentration of a predetermined gas atmosphere can be achieved can be carried out efficiently and accurately.

According the present disclosure, a purge process by which a high reaching concentration of a predetermined gas atmosphere can be achieved can be carried out for the purge target container by adopting the novel technical idea that the bottom purge nozzle main body is removably mounted on the bottom purge unit. Further, replacing operation of replacing the bottom purge nozzle main body with another bottom purge nozzle main body which is different in type or shape of a tip end portion, which is the port contacting portion, in accordance with the type or the shape of the port attached to the purge target container, and maintenance operation of the bottom purge nozzle main body can be carried out easily and smoothly. Further, with the purge apparatus and the load port, high air tightness can be secured in a contacting state of the purge apparatus with the port of the purge object container.

The above and other objects, features and advantages of the present disclosure will become apparent from the following description and the appended claims, taken in conjunction with the accompanying drawings in which like parts or elements denoted by like reference characters.

DETAILED DESCRIPTION OF THE PREFERRED EMBODIMENT

In the following, a preferred embodiment of the present disclosure is described with reference to the accompanying drawings.

Figure 1:
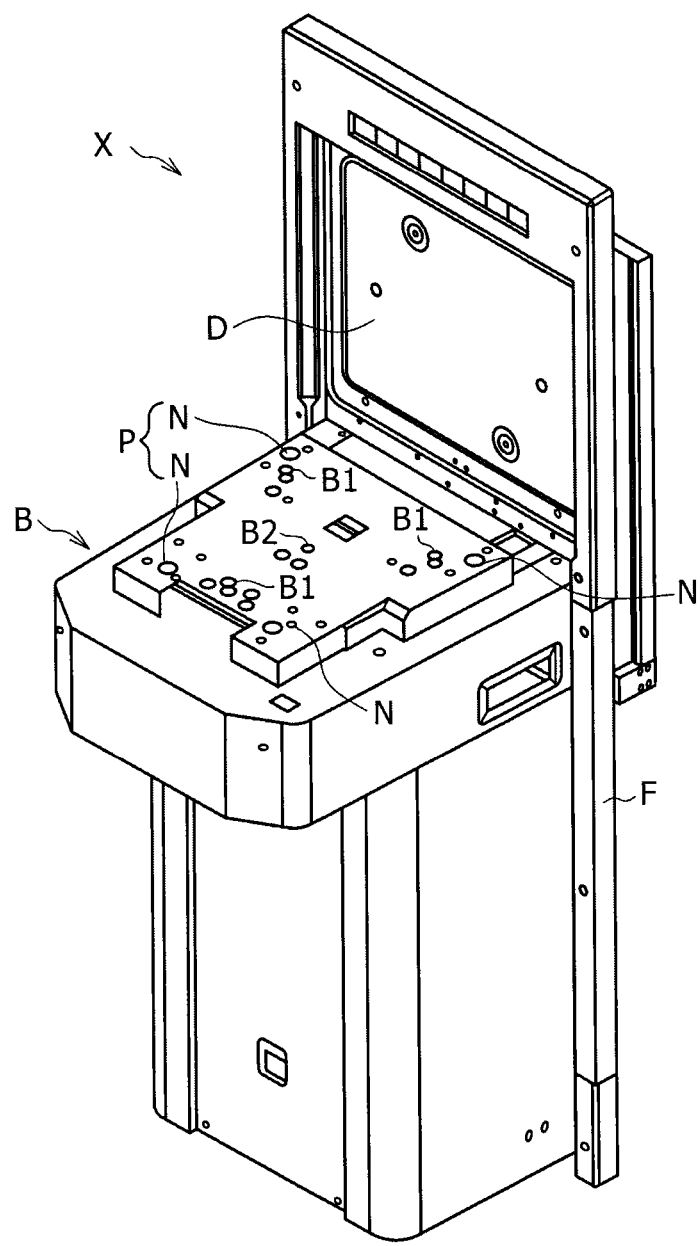
FIG. 1 is a perspective view showing a general configuration of a load port according to an embodiment of the present invention.

A purge apparatus P according to the present embodiment can be applied, for example, to a load port X shown in FIG. 1. The load port X is used in a fabrication procedure of semiconductors and is disposed adjacent a semiconductor fabrication apparatus not shown in a clean room. The purge apparatus P includes a door section D which is closely contacted with a door of a FOUP 1, which is an example of a purge object vessel in the present disclosure, to open and close the door of the FOUP 1 and carries out transfer of wafers not shown, which are accommodated articles accommodated in the FOUP 1, into and from the semiconductor fabrication apparatus.

Figure 4:
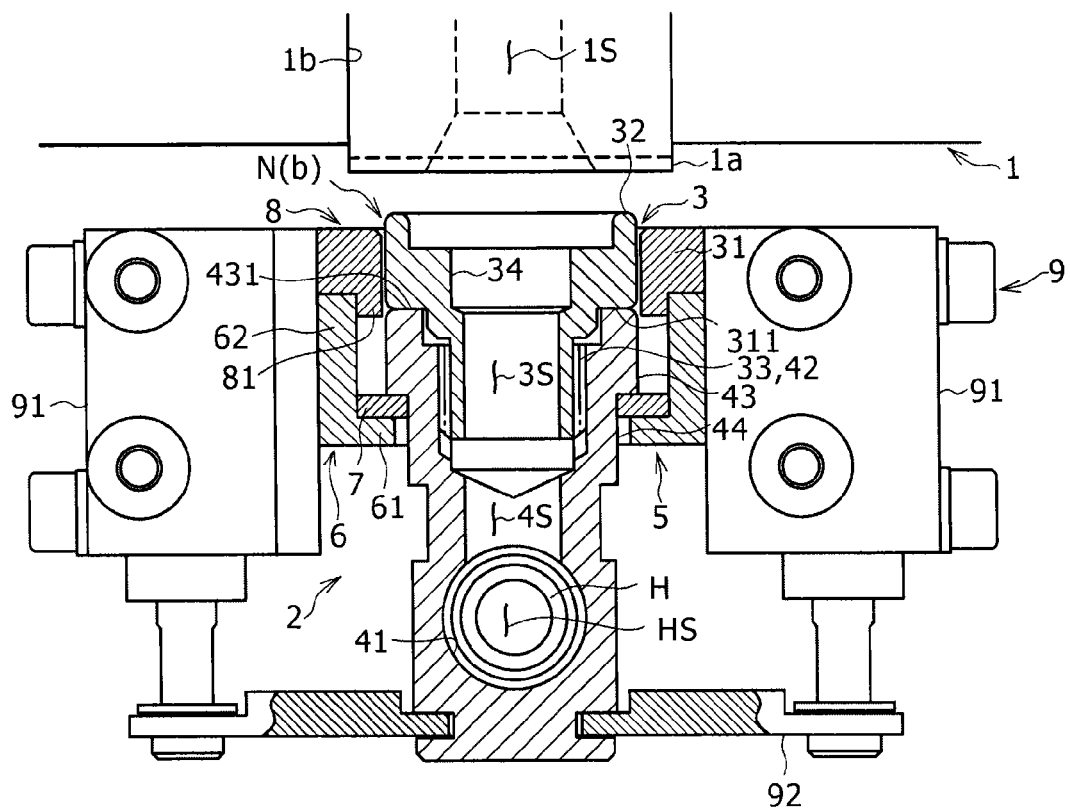
FIG. 4 is a sectional view showing a purge apparatus shown in FIG. 1 wherein a purge nozzle thereof positioned at a standby position.

The FOUP 1 applied in the present embodiment is a known apparatus which accommodates a plurality of wafers in the inside thereof and is configured such that such wafers can be carried into and out of the same through a loading entrance formed in the front face thereof and that it includes a door which can open and close the loading entrance. Therefore, a detailed description of such an apparatus is omitted. It is to be noted that the front face of the FOUP 1 in the present embodiment signifies a face of the FOUP 1 on the opposing side to the door section D of the load port X when the FOUP 1 is placed on the load port X. A port 1a for purging is provided at a predetermined place of the bottom face of the FOUP 1 as seen in FIG. 4. The port 1a is formed, for example, from a principal component in the form of a hollow cylindrical grommet seal fitted in an aperture 1b formed on the bottom face of the FOUP 1. A valve not shown is provided in the grommet seal such that it is changed over from a closed state into an open state by an injection pressure or a discharge pressure of gas such as nitrogen, inert gas or dry air hereinafter described. It is to be noted that, in the present embodiment, nitrogen gas is used as the gas, and in the following description, the gas is sometimes referred to as "purge gas."

The semiconductor fabrication apparatus includes, for example, a semiconductor fabrication apparatus main body disposed at a relatively remote position from the load port X, and a transport chamber disposed between the semiconductor fabrication apparatus main body and the load port X. In the transport chamber, a transport machine is provided which transports, for example, wafers in the FOUP 1 one by one between inside of the FOUP 1 and the inside of the transport chamber and between the inside of the transport chamber and the inside of the semiconductor fabrication apparatus main body. It is to be noted that also it is possible to transport a cassette in which a plurality of wafers are accommodated between the FOUP 1 and the semiconductor fabrication apparatus, that is, between the FOUP 1 and the semiconductor fabrication apparatus main body and transport chamber. By such a configuration as described above, in the clean room, the inside of the semiconductor fabrication apparatus main body, the inside of the transport chamber and the inside of the FOUP 1 are maintained in a high degree of purity while the space in which the load port X is disposed, or in other words, the outside of the semiconductor fabrication apparatus main body, the outside of the transport chamber and the outside of the FOUP 1 have a comparatively low degree of purity.

In the following, the configuration of the load port X according to the present embodiment is described.

Figure 2:
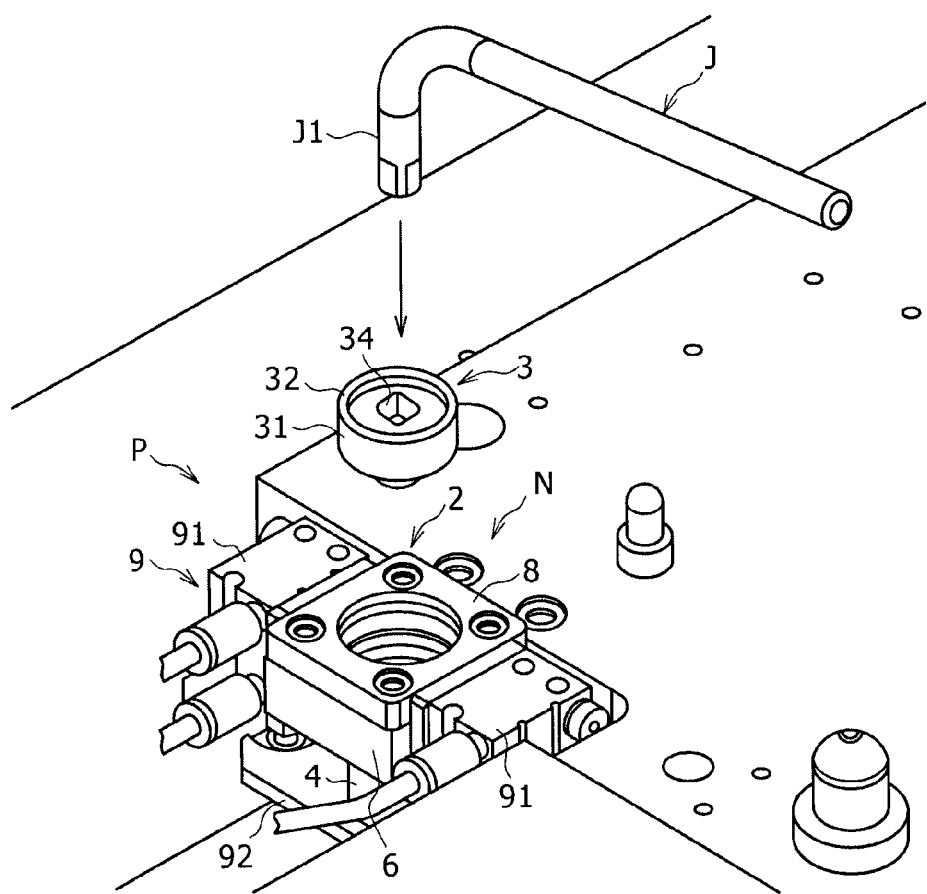
FIG. 2 is an enlarged fragmentary perspective view showing part of the load port of FIG. 1.

Referring to FIGS. 1 and 2, the load port X includes a frame F disposed in an uprightly erected posture and having the door section D capable of opening and closing an opening which can communicate with the loading entrance of the FOUP 1, a receiving table B extending from the frame F in a substantially horizontal posture in a direction in which it recedes from the semiconductor fabrication apparatus, and a purge apparatus P capable of injecting purge gas into the FOUP 1 to convert the gas atmosphere in the FOUP 1 into the purge gas such as nitrogen gas.

The door section D provided on the frame F is movable between an open position in which it closely contacts, in a state in which the FOUP 1 is placed on the receiving table B, with the door not shown provided on the front of the FOUP 1 to open the door thereby to open the loading entrance, and a closed position in which it closes up the loading entrance. For a door lifting mechanism not shown for at least moving up and down the door section D between the open position and the closed position, a known lifting mechanism can be applied.

The receiving table B is disposed in a substantially horizontal posture at a position displaced a little upwardly from a central portion of the frame F in the heightwise direction and has a plurality of positioning projections B1 which are kinematic pins projecting upwardly. The positioning projections B1 are engaged with positioning recesses not shown formed on the bottom face of the FOUP 1 to achieve positioning of the FOUP 1 on the receiving table B. The positioning projections B1 may each have such a mode that, for example, an upper portion thereof for contacting with a positioning recess having inclined wall faces opposing to each other such that an inverted V-shaped cross section is exhibited is formed so as to have a curved face which can contact in a well-balanced relationship with the opposing inclined wall faces of the positioning recess. Further, a seated state sensor B2 for detecting whether or not the FOUP 1 is placed in position on the receiving table B is provided on the receiving table B. The structure, location and so forth of the positioning projections B1 and the seated state sensor B2 can be suitably set or changed in accordance with the standards or the like. It is to be noted that the receiving table B may otherwise include a moving mechanism for moving the FOUP 1 in a placed state between a position at which the loading entrance or the door of the FOUP 1 is positioned nearest to the opening or the door section D of the frame F and another position spaced by a predetermined distance from the opening or the door section D.

Figure 3:
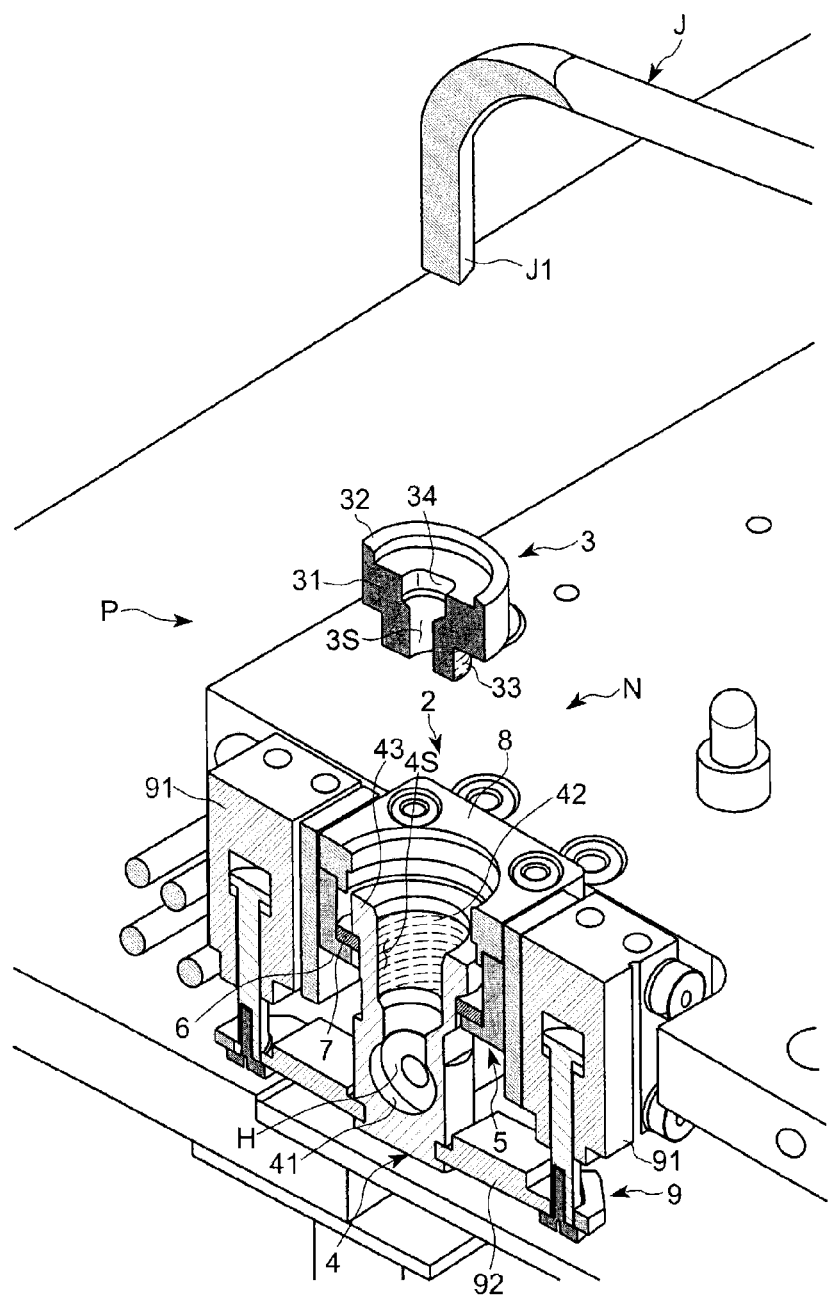
FIG. 3 is an enlarged schematic perspective view, partly in section, of the load port shown in FIG. 2.

Referring to FIG. 2 which is a partial enlarged view of the load port X, and FIG. 3 which is a partial sectional view of FIG. 2, the purge apparatus P includes a plurality of purge nozzles N disposed at predetermined places in a state in which upper end portions thereof are exposed on the receiving table B. The purge nozzles N function as injecting purge nozzles for injecting purge gas and discharge purge nozzles for discharging the gas atmosphere in the FOUP 1. The purge nozzles N can be provided at suitable positions on the receiving table B in response to the positions of the ports 1a provided on the bottom face of the FOUP 1. The purge nozzles N which are injecting purge nozzles and discharge purge nozzles have a valve function of restricting back streaming of gas and can contact with the ports 1a provided on the bottom of the FOUP 1. It is to be noted that those of the ports 1a provided on the bottom of the FOUP 1, which contact with the injecting purge nozzles, function as injecting ports while those ports which contact with the discharge purge nozzles function as discharge ports.

Referring to FIGS. 2 to 5, each of the purge nozzles N includes a bottom purge unit 2 attached to the receiving table B, and a bottom purge nozzle main body 3 removably mounted on the bottom purge unit 2.

The bottom purge unit 2 includes a base nozzle 4 having a flexible piping H attached thereto and connected to a purge gas supply source not shown and having a primary flow path 4S formed in the heightwise direction therein and communicating with an internal space HS of the piping H, and a holder 5 secured to the receiving table B for holding the base nozzle 4 for upward and downward movement, that is, for lifting and lowering movements.

Figure 6:
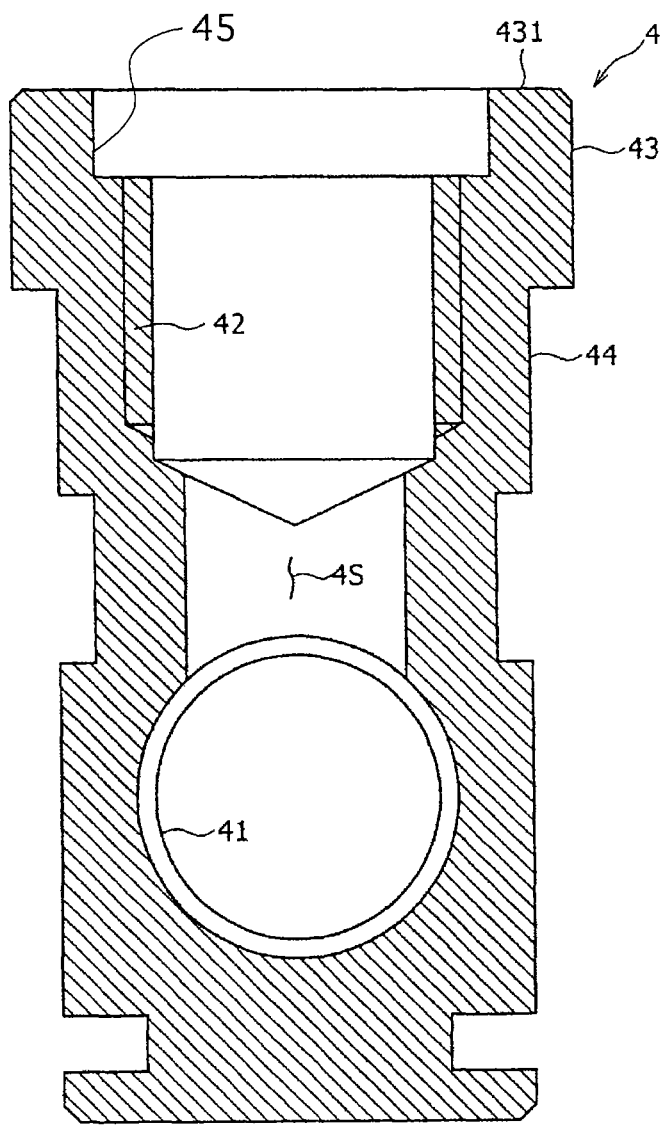
FIG. 6 is an enlarged sectional view of a base nozzle shown in FIG. 5.

Referring to FIG. 6, the base nozzle 4 has a generally bottomed tubular shape and has a piping attachment portion 41 attached to a lower end portion thereof and allowing the piping H connected to the purge gas supply source to be attached thereto. The base nozzle 4 further has a nozzle main body attachment portion 42 (corresponding to "attachment portion" in the present disclosure) formed at an upper end portion thereof and allowing the bottom purge nozzle main body 3 to be attached thereto. In the present embodiment, the nozzle main body attachment portion 42 is configured from a female thread formed on an inner circumferential face of the upper end portion of the base nozzle 4. Further, a flange portion 43 is provided at the upper end portion of the base nozzle 4 such that it has an outer diameter greater than that of the outer circumferential face of the lower end portion of the base nozzle 4. The base nozzle 4 in the present embodiment is made of metal and having the portions mentioned integrally with each other.

Referring now to FIGS. 3 and 4, the holder 5 includes a holder main body 6 which is secured to the receiving table B and integrally includes a ring portion 61 having a fitting hole formed at a central portion thereof such that portions of the base nozzle 4 other than the flange portion 43 can be fitted therein and a circumferential wall 62 extending upwardly from an outer circumferential edge of the ring portion 61. The holder 5 further includes a stopper ring 7 placed on the ring portion 61 and adapted to be abutted by the flange portion 43 of the base nozzle 4 moved downwardly to restrict further downward movement of the base nozzle 4, and a cover portion 8 having a fitting hole formed at a central portion thereof for allowing upward and downward movement of the base nozzle 4 and having a fitting portion 81 capable of fitting with the circumferential wall 62 of the holder main body 6. In the present embodiment, as shown in FIG. 4, the inner diameter of the fitting hole of the cover portion 8 is set to a value a little greater than the outer diameter of the flange portion 43 of the base nozzle 4, and the inner diameter of the stopper ring 7 is set to a value a little greater than the outer diameter of a guide object face 44 formed at a portion of the base nozzle 4 on the lower side with respect to the flange portion 43. Consequently, upon upward and downward movement of the base nozzle 4, the flange portion 43 of the base nozzle 4 slidably contacts with the fitting hole and the guide object face 44 slidably contacts with the inner circumferential face of the stopper ring 7 so that the upward and downward movement of the base nozzle 4 can be carried out smoothly and appropriately.

Figure 7:
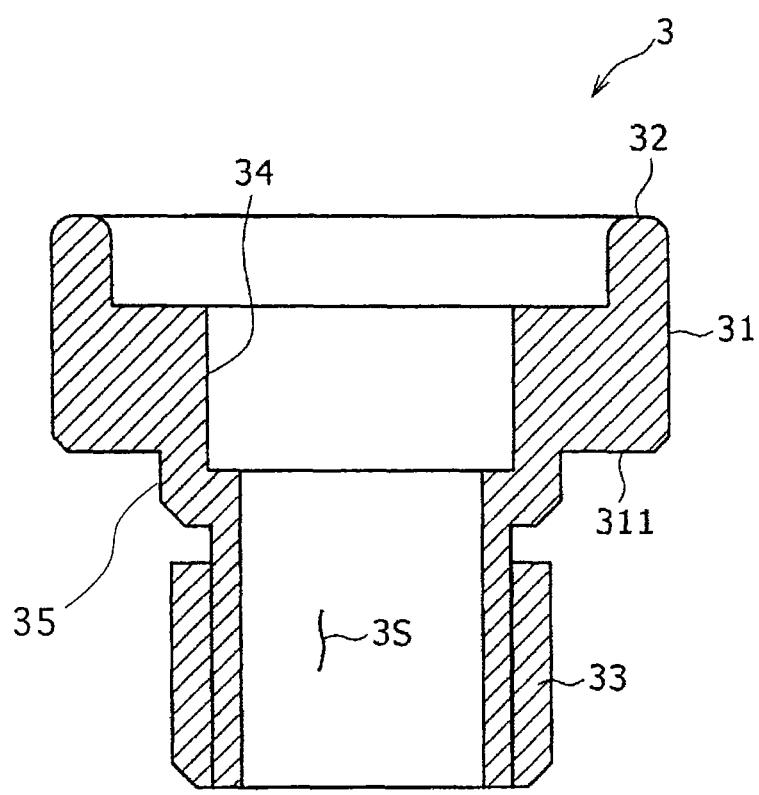
FIG. 7 is an enlarged sectional view of a bottom purge nozzle main body shown in FIG. 5.

Referring now to FIG. 7, the bottom purge nozzle main body 3 has a stepped tubular shape having a flange portion 31 provided in an upper end region thereof and has a port contacting portion 32 provided at an upper end portion thereof for contacting with the port 1a which may be an injecting port or a discharge port. The bottom purge nozzle main body 3 further has an attachment object portion 33 provided at a lower end portion thereof for engaging with the nozzle main body attachment portion 42 formed on the bottom purge unit 2, particularly on the base nozzle 4. In the present embodiment, the attachment object portion 33 is formed from a male thread formed on an outer circumferential face of a lower end portion of the bottom purge nozzle main body 3. The outer diameter of the flange portion 31 is set to a value substantially equal to or a little smaller than the outer diameter of the flange portion 43 of the base nozzle 4. The internal space of the bottom purge nozzle main body 3 functions as a secondary flow path 3S communicating with the primary flow path 4S of the base nozzle 4 in a state in which the bottom purge nozzle main body 3 is attached to the base nozzle 4. Further, the bottom purge nozzle main body 3 in the present embodiment has an operation hole 34 formed at a portion of the secondary flow path 3S for fitting with an operating end J1 (refer to FIGS. 2 and 3) of a tool J which is used for nozzle replacement. In the present embodiment, the operation hole 34 having a polygonal opening shape, in the example shown, a quadrangular opening shape, is applied, and the tool J for nozzle replacement has the operating end J1 having a cross section of a polygonal shape with which it can be fitted with the operation hole 34. Further, in the present embodiment, the port contacting portion 32 is configured from a ring-shaped upper projection which projects upwardly farther than the other portions of the flange portion 43 and has an upwardly directed face set to a smooth horizontal face. The bottom purge nozzle main body 3 in the present embodiment is a unitary member made of a metal and having the components described above.

The bottom purge nozzle main body 3 having such a configuration as described above can be mounted on the base nozzle 4 by engaging the attachment object portion 33 in the form of a male thread with the nozzle main body attachment portion 42 in the form of a female thread of the base nozzle 4 held on the holder 5. Thereupon, a downwardly directed face 311 of the flange portion 31 of the bottom purge nozzle main body 3 is abutted with an upwardly directed face 431 of the flange portion 43 of the base nozzle 4 so that further downward movement of the bottom purge nozzle main body 3 through the meshing engagement of the threads can be restricted. Further, in the present embodiment, since the downwardly directed face 311 of the flange portion 31 of the bottom purge nozzle main body 3 and the upwardly directed face 431 of the flange portion 43 of the base nozzle 4 are individually set to flat horizontal faces, also the port contacting portion 32 of the bottom purge nozzle main body 3 is a flat horizontal face in the attached state in which the downwardly directed face 311 of the flange portion 31 of the bottom purge nozzle main body 3 is abutted with the upwardly directed face 431 of the flange portion 43 of the base nozzle 4 with the attachment object portion 33 in the form of a male thread of the bottom purge nozzle main body 3 engaged or meshed with the attachment portion in the form of a female thread of the base nozzle 4.

In this manner, in the present embodiment, the purge nozzle N is configured from the bottom purge unit 2 and the bottom purge nozzle main body 3. Here, if attention is paid to the relationship between the base nozzle 4 of the bottom purge unit 2 and the bottom purge nozzle main body 3, then the bottom purge nozzle main body 3 relatively positioned on the upper side can be regarded as "upper side nozzle" while the base nozzle 4 relatively positioned on the lower side can be regarded as "lower side nozzle."

The purge apparatus P according to the present embodiment further includes a lifting mechanism 9 for moving the purge nozzle N upwardly and downwardly. Referring to FIGS. 3 and 4 and so forth, the lifting mechanism 9 includes a pair of air cylinders 91 disposed on the opposite sides of the bottom purge unit 2 for being driven, for example, by an air pressure, and a lifting holding plate 92 disposed at a position at which operating ends of the air cylinders 91 are connected to each other and adapted to hold a lower end portion of the purge nozzle N, particularly a lower end portion of the base nozzle 4. The base nozzle 4 and the bottom purge nozzle main body 3 can be moved upwardly and downwardly together with the lifting holding plate 92 by the air cylinders 91 driving the lifting holding plate 92 to move upwardly and downwardly. In the present embodiment, the purge nozzle N can be moved upwardly and downwardly by the lifting mechanism 9 between a position shown in FIG. 5, that is, a purge position (a) at which the port contacting portion 32 of the bottom purge nozzle main body 3 can contact with the port 1a and a position shown in FIG. 4, that is, a standby position (b) at which the port contacting portion 32 does not contact with the port 1a.

Now, a method of use and operation of the load port X having such a configuration as described above are described.

First, a FOUP 1 is transported to the load port X by the transport apparatus such as an OHT apparatus not shown and is placed on the receiving table B. Thereupon, the purge nozzles N are set to the standby position (b), and the positioning projections B1 are fitted into and contacted with the positioning recesses of the FOUP 1 so that the FOUP 1 can be placed at a predetermined normal position on the receiving table B. Further, it is detected by the seated state sensor B2 that the FOUP 1 is placed at the normal position on the receiving table B. At this point of time, since the purge nozzles N are positioned at the standby position (b), they do not contact with the FOUP 1. In particular, the standby position (b) of each purge nozzle N is a position at which, in the state in which the FOUP 1 is placed on the receiving table B with the positioning projections B1 engaged with the positioning recesses, the upper end of the bottom purge nozzle main body 3, that is, the port contacting portion 32, is positioned lower than the lower end of the port 1a provided on the FOUP 1.

Figure 5:
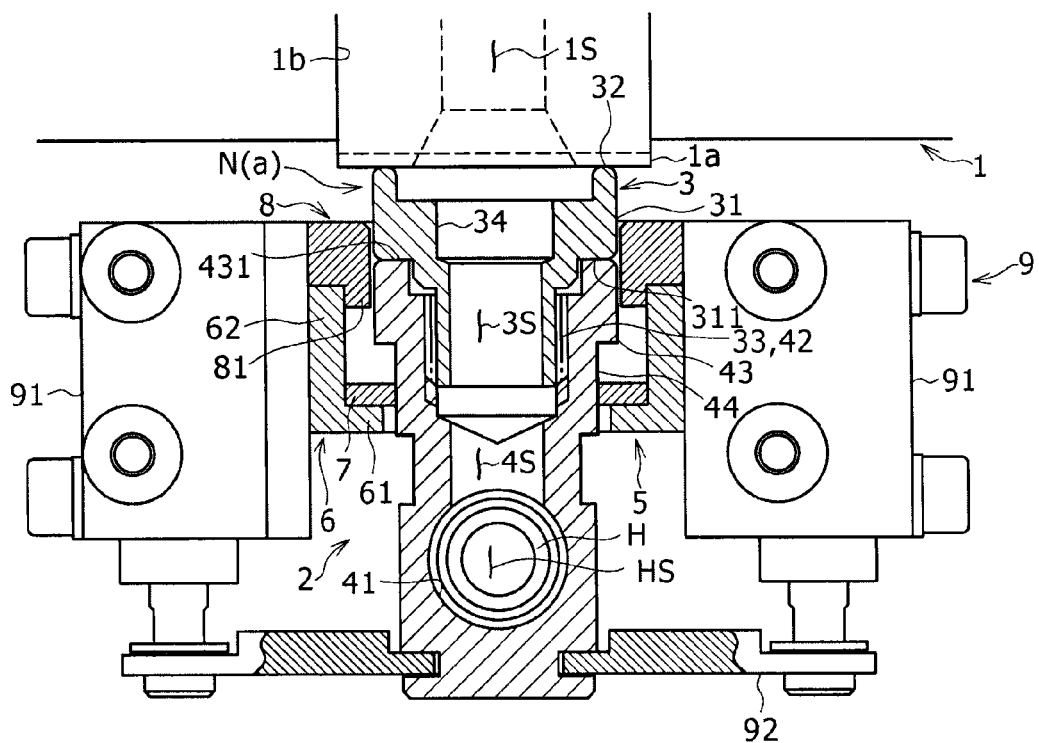
FIG. 5 is a similar view but showing the purge apparatus wherein the purge nozzle is positioned at a purge position.

After the normal seated state of the FOUP 1 is detected by the seated state sensor B2, the load port X in the present embodiment drives the lifting mechanisms 9 to move each purge nozzle N upwardly from the standby position (b) to the purge position (a). As a result, as shown in FIG. 5, the port contacting portion 32 of the bottom purge nozzle main body 3 is brought into contact with the lower end of the port 1a, whereupon an internal space 1S of the port 1a and the secondary flow path 3S of the bottom purge nozzle main body 3 and primary flow path 4S of the base nozzle 4 are communicated with each other. In this state, the load port X in the present embodiment injects purge gas supplied thereto from the supply source not shown into the FOUP 1 through the internal space HS of the piping H, primary flow path 4S, secondary flow path 3S and internal space 1S of the port 1a so that the air filled in the FOUP 1 is discharged to the outside of the FOUP 1 through the discharge port and the discharge purge nozzle. It is to be noted that the discharge process may be started earlier than the injection process to discharge the air in the FOUP 1 to the outside of the FOUP 1 to some degree such that the injection process is carried out in a state in which the inside of the FOUP 1 is decompressed.

After such purge process as described above, or during such purge process, the load port X in the present embodiment successively delivers the wafers in the FOUP 1 into the semiconductor fabrication apparatus through the loading entrance of the FOUP 1 communicated with the opening of the frame F. The wafers transferred into the semiconductor fabrication apparatus are subsequently subjected to a semiconductor fabrication process by the semiconductor fabrication apparatus main body. The wafers for which the semiconductor fabrication process is completed by the semiconductor fabrication apparatus main body are successively stored into the FOUP 1.

In the load port X of the present embodiment, also upon taking in and out of the wafers, the bottom purge process by the purge apparatus P can be carried out continuously, and also during taking in and out of the wafers, the gas atmosphere in the FOUP 1 can be continuously replaced with the purge gas such as nitrogen gas to keep the same in a high concentration.

When all wafers are accommodated into the FOUP 1 after the semiconductor fabrication process is completed therefor, the door section D is moved from the open position to the closed position in the state in which it closely contacts with the door of the FOUP 1. Consequently, the opening of the load port X and the loading entrance of the FOUP 1 are closed up. Thereafter, the FOUP 1 placed on the receiving table B is carried out to a next step by the transport apparatus not shown. It is to be noted that, if necessary, the bottom purge process may be carried out again for the FOUP 1 in which the wafers for which the semiconductor fabrication process is completed are accommodated. In this instance, the purge process can be started immediately for the FOUP 1 in which the wafers for which the semiconductor fabrication process is completed are accommodated, and prevention of oxidization of the processed wafers can be anticipated.

As described in detail above, the load port X according to the present embodiment can maintain the filling degree or replacement degree of the purge gas in the FOUP 1 at a high value by the bottom purge process by the purge apparatus P.

Further, that one of a plurality of wafers accommodated in a common FOUP 1, which is accommodated first into the FOUP 1 after the semiconductor fabrication process is completed therefor is usually exposed to the gas atmosphere in which the filling degree or replacement degree of the purge gas drops as the taking in and out operation time passes until one of wafers, which is lastly subjected to the semiconductor fabrication process, is accommodated in the FOUP 1, and slightly has a bad influence of the gas atmosphere. However, by injecting the purge gas into the FOUP 1 by means of the purge apparatus P, the drop of the filling degree or replacement degree of the purge gas in the FOUP 1 can be suppressed effectively. Consequently, the wafers can be kept accommodated in the FOUP 1 in a good state.

Incidentally, the port 1a sometimes has a different shape depending upon the type, individual difference and so forth of the FOUP 1. Thus, such a situation may possibly occur that, unless an appropriate purge nozzle N conforming to the shape of the port 1a is contacted with the port 1a, high air tightness between the internal space 1S of the port 1a and the secondary flow path 3S of the bottom purge nozzle main body 3 and primary flow path 4S of the base nozzle 4 cannot be secured.

Therefore, the purge apparatus P according to the present embodiment is configured such that the bottom purge nozzle main body 3 is removably attached to the holder 5 so as to cope with such a situation as described above. Consequently, it is possible to remove only the bottom purge nozzle main body 3 from the bottom purge unit 2 and attach a bottom purge nozzle main body 3 of a different type to the bottom purge unit 2 in response to the type or the shape of the port 1a. The operation of removing the bottom purge nozzle main body 3 from the bottom purge unit 2 and the operation of attaching another bottom purge nozzle main body 3 to the bottom purge unit 2 can be carried out using such the tool J as shown in FIG. 2. In particular, the operating end J1 formed at a tip end portion of the tool J and having a cross section of a polygonal shape is inserted and fitted into the operation hole 34 which is open upwardly in the bottom purge nozzle main body 3. In this state, operating force to turn the tool J in a predetermined direction is applied to the tool J to cancel the engagement state or threaded engagement state between the attachment portion in the form of a female thread of the base nozzle 4 and the attachment object portion 33 in the form of a male thread of the bottom purge nozzle main body 3. On the other hand, by applying operating force to turn the tool J in the opposite direction to the tool J in a state in which the operating end J1 of the tool J is inserted and fitted in the operation hole 34 of the bottom purge nozzle main body 3, the attachment object portion 33 in the form of a male thread of the bottom purge nozzle main body 3 can be engaged or meshed with the attachment portion in the form of a female thread of the base nozzle 4 to attach the bottom purge nozzle main body 3 to the bottom purge unit 2.

In this manner, with the purge apparatus P according to the present embodiment, since the bottom purge nozzle main body 3 is removably attached to the bottom purge unit 2 which is attached in a fixed state to the receiving table B, when the type of the purge nozzle N is to be changed in response to the type or the shape of the port 1a which differs depending upon the type of the FOUP 1, only the bottom purge nozzle main body 3 can be replaced appropriately without requiring a complicated operation of removing the entire purge nozzle N from the receiving table B and re-mounting another purge nozzle N on the receiving table B. Consequently, a good contact state in which high air tightness with the port 1a is secured can be secured.

Figure 8:
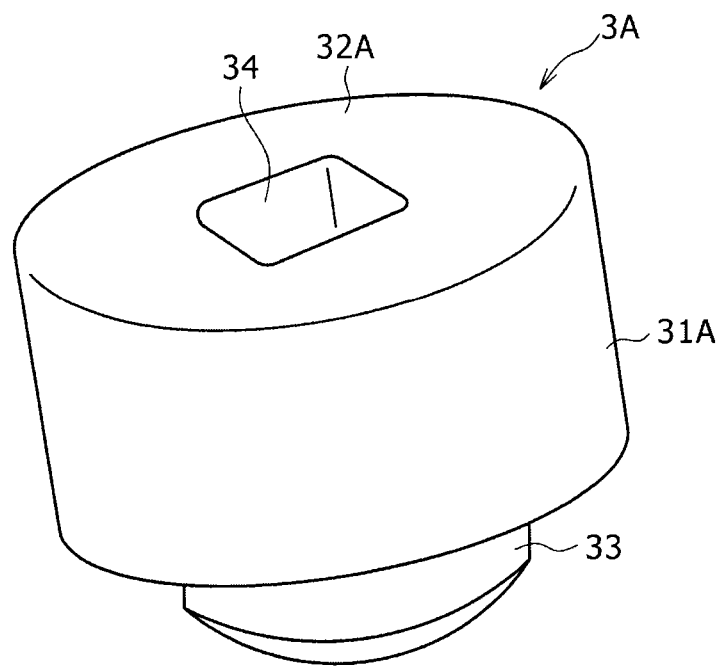
FIG. 8 is a perspective view showing a modified form of the bottom purge nozzle main body.
Figure 9:
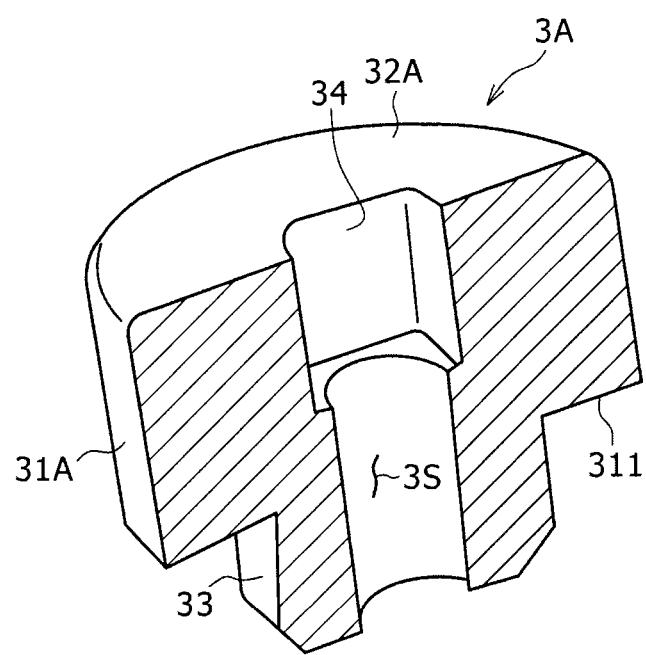
FIG. 9 is a perspective sectional view of the modified bottom purge nozzle main body of FIG. 8.
Figure 10:
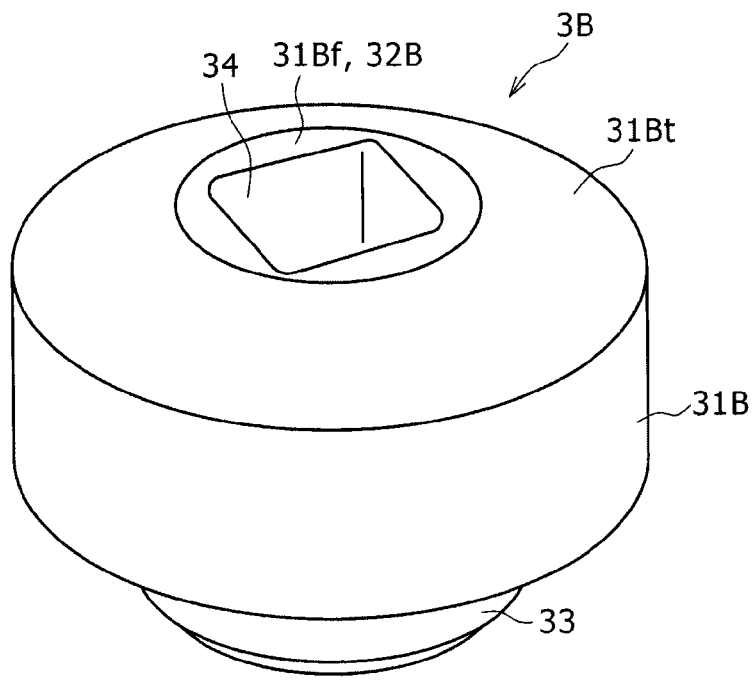
FIG. 10 is a perspective view showing another modified form of the bottom purge nozzle main body.
Figure 11:
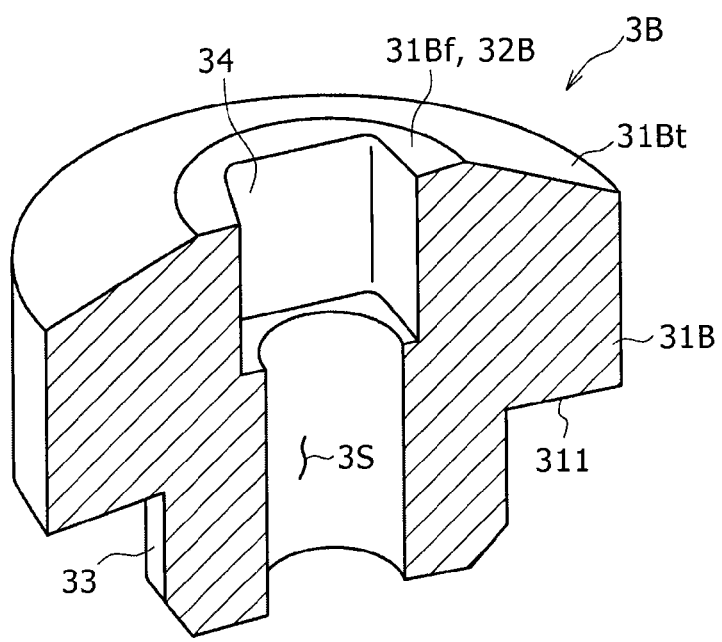
FIG. 11 is a perspective sectional view of the modified bottom purge nozzle main body of FIG. 10.

Here as variations of the bottom purge nozzle main body 3, a bottom purge nozzle main body 3A as shown in FIGS. 8 and 9 and another bottom purge nozzle main body 3B shown in FIGS. 10 and 11 are available.

Referring first to FIGS. 8 and 9, the bottom purge nozzle main body 3A is similar in shape and structure to the bottom purge nozzle main body 3 except that it is different from the bottom purge nozzle main body 3 in that an overall upwardly directed face of a flange portion 31A thereof is formed as a horizontal face so as to function as a port contacting portion 32A. It is to be noted that, in FIGS. 8 and 9, corresponding portions to those of the bottom purge nozzle main body 3 are denoted by like reference characters.

Referring now to FIGS. 10 and 11, the bottom purge nozzle main body 3B is similar in shape and structure to the bottom purge nozzle main body 3 except that it is different from the bottom purge nozzle main body 3 in that an upwardly directed face of a flange portion 31B is formed from a tapering face 31Bt inclined such that the height gradually increases toward the center and a flat horizontal face 31Bf continuous to the tapering face 31St, and the horizontal face 31Bf functions as a port contacting portion 32B. Thus, in FIGS. 10 and 11, corresponding portions to those of the bottom purge nozzle main body 3 are denoted by like reference characters.

Also the bottom purge nozzle main bodies 3A and 3B can be attached to and removed from the bottom purge unit 2 simply by a procedure same as the procedure or operation method of mounting and removing the bottom purge nozzle main body 3.

Further, in the present embodiment, even if the port contacting portion 32 of the bottom purge nozzle main body 3 which can contact with the port 1a suffers from abrasion, damage or deformation in response to time-dependent degradation or the frequency of use, by attaching a new bottom purge nozzle main body 3 or another bottom purge nozzle main body 3 which does not suffer from abrasion, damage or deformation in place of the bottom purge nozzle main body 3 currently used, a good contact state in which high air tightness with the port 1a is secured can be secured.

Furthermore, the purge apparatus P according to the present embodiment is set such that the port contacting portion 32 of the bottom purge nozzle main body 3 is positioned at a fixed position in a state in which the attachment object portion 33 of the bottom purge nozzle main body 3 is held in engagement with the nozzle main body attachment portion 42 of the bottom purge unit 2. Therefore, in comparison with an alternative mode wherein a seal member for exclusive use is interposed between the purge apparatus P and the port 1a to secure high air tightness, the seal member for exclusive use is unnecessary, and the horizontal datum plane of the FOUP 1 prescribed by the standards can be set with a high degree of accuracy without taking the heightwise dimension of the seal member into consideration.

Further, with the purge apparatus P of the present embodiment, the attaching operation of the bottom purge nozzle main body 3 to the bottom purge unit 2 can be carried out simply and appropriately by applying operating force to turn the bottom purge nozzle main body 3 till a point of time at which the downwardly directed face 311 of the flange portion 31 of the bottom purge nozzle main body 3 is abutted with the upwardly directed face 431 of the flange portion 43 of the base nozzle 4 to restrict further downward movement of the bottom purge nozzle main body 3. Further, in the attached state, since the downwardly directed face 311 of the flange portion 31 of the bottom purge nozzle main body 3 and the upwardly directed face 431 of the flange portion 43 of the base nozzle 4 which are set as mutually flat horizontal faces contact with each other, high air tightness can be secured by contacting such a horizontal port contacting portion 32 as just described with the port 1a.

Further, in the present embodiment, the bottom purge nozzle main body 3 is configured such that it can be mounted on the bottom purge unit 2 by engaging the attachment object portion 33 of the bottom purge nozzle main body 3 with the nozzle main body attachment portion 42 of the bottom purge unit 2. Therefore, in comparison with an alternative mode wherein the bottom purge nozzle main body is merely thrust into and attached to the bottom purge unit, a behavior of the bottom purge nozzle main body 3 wavering with respect to the bottom purge unit 2 can be prevented or suppressed and the port 1a of the FOUP 1 can be contacted with the port contacting portion 32, which extends substantially horizontally, in a state in which high air tightness is secured.

Further, in the purge apparatus P of the present embodiment, the attachment object portion 33 is configured from a male thread and the attachment portion is configured from a female thread such that, by screwing the male thread on the female thread, the bottom purge nozzle main body 3 is set such that it can be attached to the bottom purge unit 2. Therefore, while the structure is simple, a replacing operation of the bottom purge nozzle main body 3 can be carried out readily with a high degree of accuracy.

It is to be noted that the present disclosure is not limited to the embodiment described above. For example, as a mode wherein the attachment object portion of the bottom purge nozzle main body and the attachment portion of the bottom purge unit are engaged with each other, another mode may be adopted wherein one of the attachment object portion and the attachment portion is a recessed portion while the other is a projected portion such that the projected portion and the recessed portion are engaged with each other. Or, a further mode may be adopted wherein the attachment object portion is inserted into the attachment portion and pivotally turned in a predetermined direction to establish a locked state. Or else, a configuration wherein the relationship of the male and female threads is reversed between the attachment object portion and the attachment portion, particularly a configuration wherein the attachment object portion is configured from a female thread provided on an inner circumferential face of the bottom purge nozzle main body and the attachment portion is configured from a male thread provided on an outer face of a predetermined portion of the bottom purge unit, may be adopted.

Or, a portion to which operating force is applied upon attachment or removal of the bottom purge nozzle main body to or from the bottom purge unit, in the embodiment described above, the operation hole 34, may be formed on the outer face of the bottom purge nozzle main body. As an example, a mode wherein the outer face of the flange portion of the bottom purge nozzle main body is formed so as to have a cross section of a polygonal shape may be applicable. Further, the bottom purge nozzle main body and the bottom purge unit may be configured such that an operation of attaching or removing the bottom purge nozzle main body to or from the bottom purge unit can be carried out by a hand of an operator without using a tool for exclusive use.

Further, the bottom purge unit may be configured such that it does not include the base nozzle while the attachment object portion of the bottom purge nozzle main body is engaged with the attachment portion provided at a suitable place of the bottom purge unit such that the bottom purge nozzle main body can be attached to the bottom purge unit.

Further, it is possible to apply, as the lifting mechanism for moving the purge nozzle upwardly and downwardly, a mechanism configured using a cylinder of the liquid-operated type or of the pressurized gas operated type or the like, or a mechanism configured using a ball screw, a belt, a rack and a pinion, or an electromagnetic linear actuator. It is to be noted that also a mode wherein the purge nozzle is fixed at a purge position, that is, is held against upward and downward movement, may be adopted. Also in this instance, for example, since the attachment object portion of the bottom purge nozzle main body and the attachment portion of the bottom purge unit can be engaged with each other such that the bottom purge nozzle main body can be mounted on the bottom purge unit, even if a purge object vessel swings leftwardly and rightwardly and hits the bottom purge nozzle main body in the process in which the purge object vessel is placed on the receiving table by a transport apparatus such as an OHT or at the point of time of such placement, the behavior of the bottom purge nozzle main body wavering with respect to the bottom purge unit can be prevented or suppressed. Thus, a good contacting state with the port can be secured.

Furthermore, while the purge object vessel in the embodiment described above is a FOUP, it may be some other vessel or carrier, and also the accommodation object to be accommodated in the purge object vessel is not limited to a wafer but may be a glass substrate used for a display device or a photoelectric conversion device.

Also it is possible to apply the purge apparatus to an apparatus different from a load port such as a stocker for storing purge object vessels or a purge station.

Also the particular configurations of the components are not limited to those of the embodiment described hereinabove and can be modified in various forms without departing from the subject matter of the present disclosure.

It should be understood by those skilled in the art that various modifications, combinations, sub-combinations and alterations may occur depending on design requirements and other factor in so far as they are within the scope of the appended claims or the equivalents thereof.

What is claimed is:

1. A purge apparatus for replacing a gas atmosphere in a purge object vessel by a purge gas through a port provided on a bottom face of the purge object vessel, the purge apparatus comprising:
    a purge unit attached to a table that receives the purge object vessel, the purge unit including an attachment portion; and
    a purge nozzle body including a port contacting portion provided on an upper side of the purge nozzle body, and an attachment object portion provided on a lower side of the purge nozzle body, wherein
    the port contacting portion of the purge nozzle body is configured to contact the port of the purge object vessel, the attachment object portion of the purge nozzle body is configured to removably engage with the attachment portion of the purge unit, and the purge nozzle body is configured to be removably attached to the purge unit by removably engaging the attachment object portion with the attachment portion, the attachment object portion being one of a male threaded portion and a female threaded portion, the attachment portion being one of the female threaded portion and the male threaded portion corresponding to the attachment object portion, and the attachment object portion being removably engaged with the attachment portion by screwing the male threaded portion with the female threaded portion.

2. A purge apparatus for replacing a gas atmosphere in a purge object vessel by a purge gas through a port provided on a bottom face of the purge object vessel, the purge apparatus comprising:
    a purge unit attached to a table that receives the purge object vessel, the purge unit including an attachment portion;
    a purge nozzle body including a port contacting portion provided on an upper side of the purge nozzle body and an attachment object portion provided on a lower side of the purge nozzle body, wherein
    the port contacting portion of the purge nozzle body is configured to contact the port of the purge object vessel, the attachment object portion of the purge nozzle body is configured to removably engage with the attachment portion of the purge unit, and the purge nozzle body is configured to be removably attached to the purge unit by removably engaging the attachment object portion with the attachment portion,
    the port contacting portion of the purge nozzle body is substantially horizontally positioned at a predetermined position when the attachment object portion of the purge nozzle body is engaged with the attachment portion of the purge unit; and
    a lifting mechanism configured to move the purge unit in a vertical direction with respect to the table,
    wherein
    the predetermined position is on a horizontal datum plane of the purge object vessel as defined by SEMI standard, and
    the port contacting portion is positioned lower than the horizontal datum plane of the purge object vessel which is a predetermined standard in a state in which the purge object vessel is placed on a receiving table before the purge unit is moved upwardly by the lifting mechanism and contacts with the port of the purge object vessel.

3. The purge apparatus according to claim 2, wherein the port contacting portion does not change the shape before and after when a port contacting portion and a port are in contact.

4. A purge apparatus for replacing a gas atmosphere in a purge object vessel by a purge gas through a port provided on a bottom face of the purge object vessel, the purge apparatus comprising:
    a purge unit attached to a table that receives the purge object vessel, the purge unit including an attachment portion; and
    a purge nozzle body including a port contacting portion provided on an upper side of the purge nozzle body and an attachment object portion provided on a lower side of the purge nozzle body, wherein
    the port contacting portion of the purge nozzle body is configured to contact the port of the purge object vessel, the attachment object portion of the purge nozzle body is configured to removably engage with the attachment portion of the purge unit, and the purge nozzle body is configured to be removably attached to the purge unit by removably engaging the attachment object portion with the attachment portion,
    the port contacting portion of the purge nozzle body is substantially horizontally positioned at a predetermined position when the attachment object portion of the purge nozzle body is engaged with the attachment portion of the purge unit, and
    the port contacting portion does not change the shape before and after when a port contacting portion and a port are in contact.

5. The purge apparatus according to claim 4, wherein the attachment object portion being one of a male thread portion and a female thread portion, the attachment portion being one of the female thread portion and the male thread portion corresponding to the attachment object portion, and the attachment object portion being removably engaged with the attachment portion by screwing the male thread portion with the female thread portion.

6. The purge apparatus according to claim 4, further comprising:
    a lifting mechanism configured to move the purge unit in a vertical direction with respect to the table, wherein
    the predetermined position is on a horizontal datum plane of the purge object vessel as defined by SEMI standard, and
    the port contacting portion is positioned lower than the horizontal datum plane of the purge object vessel which is a predetermined standard in a state in which the purge object vessel is placed on a receiving table before the purge unit is moved upwardly by the lifting mechanism and contacts with the port of the purge object vessel.

7. The purge apparatus according to claim 4, wherein a flange portion is provided at the purge nozzle body such that the flange portion has an outer diameter greater than that of the outer circumferential face of the attachment object portion, in a state in which the attachment object portion of the purge nozzle body of and the attachment portion of the purge unit are removably engaged, and a projection portion is provided at the purge nozzle body in-between the flange portion and the attachment object portion such that the projection portion has an outer diameter smaller than the outer circumferential face of the flange portion, and greater than the outer circumferential face of the attachment object portion, the concave portion is provided in the purge unit in-between upper end thereof and the attachment portion such that the concave portion with upper opened concave shape has outer diameter greater than the outer circumferential face of the attached portion and greater than outer circumferential face of the attachment object portion.

8. A purge apparatus for replacing a gas atmosphere in a purge object vessel by a purge gas through a port provided on a bottom face of the purge object vessel, the purge apparatus comprising:

a purge unit attached to a table that receives the purge object vessel, the purge unit including an attachment portion; and a purge nozzle body including a port contacting portion provided on an upper side of the purge nozzle body and an attachment object portion provided on a lower side of the purge nozzle body, wherein the port contacting portion of the purge nozzle body is configured to contact the port of the purge object vessel, the attachment object portion of the purge nozzle body is configured to removably engage with the attachment portion of the purge unit, and the purge nozzle body is configured to be removably attached to the purge unit by removably engaging the attachment object portion with the attachment portion, a flange portion is provided at the purge nozzle body such that the flange portion has an outer diameter greater than that of the outer circumferential face of the attachment object portion in a state in which the attachment object portion of the purge nozzle body of and the attachment portion of the purge unit are removably engaged, and a projection portion is provided at the purge nozzle body in-between the flange portion and the attachment object portion such that the projection portion has an outer diameter smaller than the outer circumferential face of the flange portion, and greater than the outer circumferential face of the attachment object portion, the concave portion is provided in the purge unit in-between upper end thereof and the attachment portion such that the concave portion with upper opened concave shape has outer diameter greater than the outer circumferential face of the attached portion and greater than outer circumferential face of the attachment object portion.

* * * * *